United States Patent [19]
Weng et al.

[11] Patent Number: 5,948,117
[45] Date of Patent: Sep. 7, 1999

[54] MODIFIED REED-SOLOMON ERROR CORRECTION SYSTEM USING (W+I+1)-BIT REPRESENTATIONS OF SYMBOLS OF GF ($2^{W+I}$)

[75] Inventors: Lih-Jyh Weng, Needham; Ba-Zhong Shen, Shrewsbury, both of Mass.; Shih Mo, Milpitas, Calif.

[73] Assignee: Quantum Corporation, Milpitas, Calif.

[21] Appl. No.: 08/786,894

[22] Filed: Jan. 23, 1997

[51] Int. Cl.⁶ .................................................. H03M 13/00
[52] U.S. Cl. ........................................... 714/784; 714/785
[58] Field of Search ............................. 371/37.11, 37.12, 371/37.5, 45, 37.07–37.09

[56] References Cited

U.S. PATENT DOCUMENTS 4,413,339   11/1983   Riggle et al. .......................... 371/40.3
4,856,003   8/1989    Weng .................................... 371/37.11

Primary Examiner—Emmanuel L. Moise
Attorney, Agent, or Firm—Cesari and McKenna, LLP

[57] ABSTRACT

An error correction system includes an encoder that uses a modified Reed-Solomon code to encode w-bit data symbols over GF($2^{w+i}$) and form a preliminary code with d−1 (w+i+1)-bit redundancy symbols. The preliminary code word is modified as necessary to set for each symbol a selected i bits to the same value as a corresponding $i+1^{st}$ bit. The preliminary code word also includes R pseudo redundancy symbols that are required for decoding the modified code word. The i+1 bits are then truncated from each of the code word symbols, to form a code word with w-bit symbols. The Galois Field GF($2^{w+i}$) is selected such that the elements of the field can be represented by (w+i+1)-bit symbols that are determined by a polynomial h(x) modulo an irreducible polynomial p(x), which is $$p(x)=x^{w+i}+x^{w+i-1}+\ldots+x^1+x^0,$$

with the polynomial h(x) representing a primitive element. The encoder uses the lower weight representations of the (w+i+1)-bit symbols and performs multiplication and raising the symbols to powers of $2^i$ as combinations of cyclic shifts and permutations that are readily performed in hardware. A decoder decodes the code word as (w+i+1)-bit symbols to take advantage of the simplified multiplication and exponentiation operations.

17 Claims, 5 Drawing Sheets

MODIFIED REED-SOLOMON ERROR CORRECTION SYSTEM USING (W+I+1)-BIT REPRESENTATIONS OF SYMBOLS OF GF $(2^{W+I})$

FIELD OF THE INVENTION

The invention relates to a modified Reed-Solomon error correction encoder.

BACKGROUND OF THE INVENTION

The importance of error correction coding of data in digital computer systems has increased greatly as the density of the data recorded on mass storage media, more particularly disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is written to a disk, it is mathematically encoded to form ECC symbols. The ECC symbols are then appended to the data string to form code words—data symbols plus ECC symbols—and the code words are written to or stored on the disks. When data is to be read from the disks, the code words containing the data symbols to be read are retrieved from the disks and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, *Error Correction Codes*]. To correct multiple errors in strings of data symbols, Reed-Solomon codes efficiently and effectively utilize the various mathematical properties of sets of symbols known as Galois Fields, represented "GF $(P^q)$", where "P" is a prime number and "q" can be thought of as the number of digits, base P, in each element or symbol in the field. "P" usually has the value 2 in digital computer applications and, therefore, "q" is the number of bits in each symbol.

The number of symbols which an ECC based on a Reed-Solomon code can effectively encode and correct, or "protect," is limited by the size of the Galois Field selected, i.e. $P^q$ symbols, and the maximum number of errors which the code is to be capable of correcting. The maximum length of a cyclic Reed-Solomon code word for GF $(P^q)$ is $P^q-1$ symbols. Thus the maximum number of data symbols which can be protected by the ECC, that is, included in the code word, is $P^q-1$ symbols minus "e," where "e" is the number of ECC symbols. The larger the Galois Field, the longer the code word, and the more data the ECC can protect for a given maximum number of errors to be corrected.

While larger Galois Fields could be used to protect larger strings of data symbols, is using Galois Fields that result in code word symbols that have a number of bits that is greater than eight and not a multiplier of eight, complicates the circuitry of the system. The remainder of the system operates with 8-bit symbols or bytes, or symbols that are multiples of eight bits. Accordingly, if the ECC uses symbols that are longer than eight bits, the system must include an interface to translate the symbols between the 8-bit symbols used by the remainder of the system and the longer symbols used by the ECC circuitry.

An ECC based on GF $(2^8)$ can protect a string of up to 253 8-bit data symbols or "data bytes" against a single error, if two 8-bit ECC symbols are appended to the data, making the code word 255 or $2^8-1$ bytes long. If the ECC is to correct more than one error, more ECC symbols, two for each additional error to be corrected, must be used in the code word. This means that fewer data bytes can be protected for a given length of code word.

Information is often stored on magnetic disks in sectors which are 512 or 576 bytes in length. Therefore, ECC's which are based on GF $(2^8)$ must be interleaved some number of times to protect an entire 512 or 576 byte sector. Interleaving effectively splits the string of data symbols into several smaller segments, i.e., segments of less than 255 symbols each, and treats each segment as a stream of data symbols to be encoded. The benefits of interleaving are that it permits a larger number of data symbols to be encoded by a given code, and that it effectively separates bursts of errors by encoding adjacent data symbols in different code words. However, in the systems that use interleaving there is a chance that the error correction actually introduces errors by modifying the data symbols to produce valid, but incorrect, code words. To prevent this "miscorrection" a separate error detection code, or cross-check, is typically used to ensure that the modifications made using the interleaved error correction code produce the correct data symbols.

In prior systems 8-bit-symbol error detection codes ("EDCs") over GF $(2^8)$ or 16-bit-symbol error detection codes over GF $(2^{16})$ are used. The 8-bit-symbol codes are easy to implement but are relatively weak, with maximum distances of only two. Alternatively, the more powerful 16-bit-symbol codes are complex to implement, requiring manipulation of 16-bit symbols.

An error detection code based on GF $(2^{10})$ has sufficient code word length, i.e. $2^{10}-1$ or 1023 symbols per code word, to readily cross check an entire sector. However, the encoding and decoding of the 10-bit symbols used in a GF $(2^{10})$ code present certain problems.

As discussed above, computer transmission and storage hardware is set up for bytes, i.e. 8-bit symbols, or symbols whose length are some multiple of 8-bits, such as 16-bit symbols. Thus they are, in general, not arranged for manipulation of 10-bit symbols. Therefore, if a GF $(2^{10})$ EDC is to be used, the information has to be translated back and forth between bytes and 10-bit symbols, first for encoding as 10-bit symbols, next for transmission and storage as bytes, and finally for decoding as 10-bit symbols. The requirement of translating between bytes and 10-bit symbols at both the encoder and the decoder adds the complexity of another step to the EDC cross check process. Further, since the data are modulated by modulation codes that are based on 8-bit symbols, using 10-bit symbols for the EDC may result in more errors since a modulation code symbol may be demodulated into more than one EDC symbol. Thus, an erroneous demodulation of one modulation code word symbol may result in two erroneous EDC code word symbols.

One solution is to generate a code word in GF $(2^{10})$ to protect up to 1023 bytes (data, ECC symbols) and yet use 8-bit symbols, or bytes, as the EDC symbols. In a prior system that uses an ECC over GF $(2^{10})$, one or more predetermined pseudo data bytes are appended to the data bytes and the string comprised of the data bytes plus the pseudo data bytes is encoded to produce the desired number of 10-bit ECC symbols. Then, two selected bits in each of the 10-bit ECC symbols are compared to a known 2-bit pattern, e.g. "00." If the selected two bits in each of the 10-bit ECC symbols are the same as the 2-bit pattern, the selected bits of the ECC symbols are ignored or truncated and the remaining 8 bits of each of the ECC symbols are concatenated with the data bytes and the appended pseudo data bytes to form the code word. The code word bytes can later be decoded, and any error correction performed, by appending the known 2-bit truncation pattern as necessary for Galois Field addition and/or multiplication.

If any of the selected bits in any of the ECC 10-bit symbols are not the same as the truncation pattern, the appended pseudo data bytes are modified such that encoding the data bytes plus the modified pseudo data bytes produces 10-bit ECC symbols with the selected bits the same as the truncation pattern. Then the selected bits, which are now the same as the known truncation pattern, are ignored and the remaining 8 bits of each of the ECC symbols and the modified pseudo data bytes are stored along with the data bytes as the code word. Again, the modified pseudo data bytes and the remaining 8 bits of the ECC symbols contain all the information necessary to allow the decoding and error correction of the code word as bytes.

The prior system is discussed in U.S. Pat. No. 4,856,003 entitled Error Correction Code Encoder, which is assigned to a common assignee. We have devised an error detection/correction system that uses less complex circuitry to manipulate the data in accordance with a generator polynomial $g(x)$ over $GF(2^{10})$ and produce code word redundancy symbols in $GF(2^8)$. Such a system can also be used to encode data over selected fields $GF(2^{w+i})$ and produce redundancy symbols in $GF(2^w)$.

SUMMARY OF THE INVETION

The improved Reed-Solomon error correction system encodes w-bit data symbols in accordance with a generator polynomial $g(x)$ over a selected field $GF(2^{w+i})$ and produces (w+i+1)-bit EDC redundancy symbols. The encoder forms a preliminary EDC code word with these symbols as the coefficients of the terms, $x^{d-1}, x^{d-2} \ldots x^1$ and modifies the EDC redundancy symbols by combining the preliminary EDC code word with a combination of one or more EDC modifying code words. This results in modified EDC redundancy symbols that have i+1 selected bits set to all 0s or all 1s, and in "R" (w+i+1)-bit pseudo redundancy symbols, which are appended to the modified EDC symbols.

The encoding system next complements the modified EDC symbols with the i+1 bits set to all 1s, to produce symbols with their i+1 bits set to all 0s. It then truncates the all-zero i+1 bits from each of the modified EDC symbols and the pseudo-redundancy symbols, and produces an EDC code word that has symbols that are elements of $GF(2^w)$.

To decode the EDC code word, the decoder decodes the entire EDC code word including the pseudo redundancy symbols to produce the appropriate error syndromes. The decoder may decode the EDC code word as (w+i)-bit symbols, or it may decode the EDC code word as (w+i+1)-bit symbols and use less complex circuitry to perform certain Galois Field operations, as discussed in more detail below.

More specifically, certain Galois fields, $GF(2^{w+i})$, can be generated by an irreducible polynomial $$p(x)=x^{w+i}+x^{w+i-1}+ \ldots +x^1+x^0$$

The field elements can then be express as powers of $h(x)$ modulo $p(x)$, where $h(x)$ is a polynomial that represents a primitive field element. The error correction system uses (w+i+1)-bit representations of the elements of $GF(2^{w+i})$, to simplify the circuitry that performs Galois Field operations such as multiplication and raising the elements to powers of $2^i$. Using the (w+i+1)-bit representations, the system performs these field operations as combinations of cyclic shifts and permutations, as discussed in more detail below.

BRIEF DESCRIPTION OF THE DRAWINGS

The above and further advantages of the invention may be better understood by referring to the following description in conjunction with the accompanying drawings, in which.

DETAILED DESCRIPTION OF AN ILLUSTRATIVE EMBODIMENT

1. Field Operations

Figure 1:
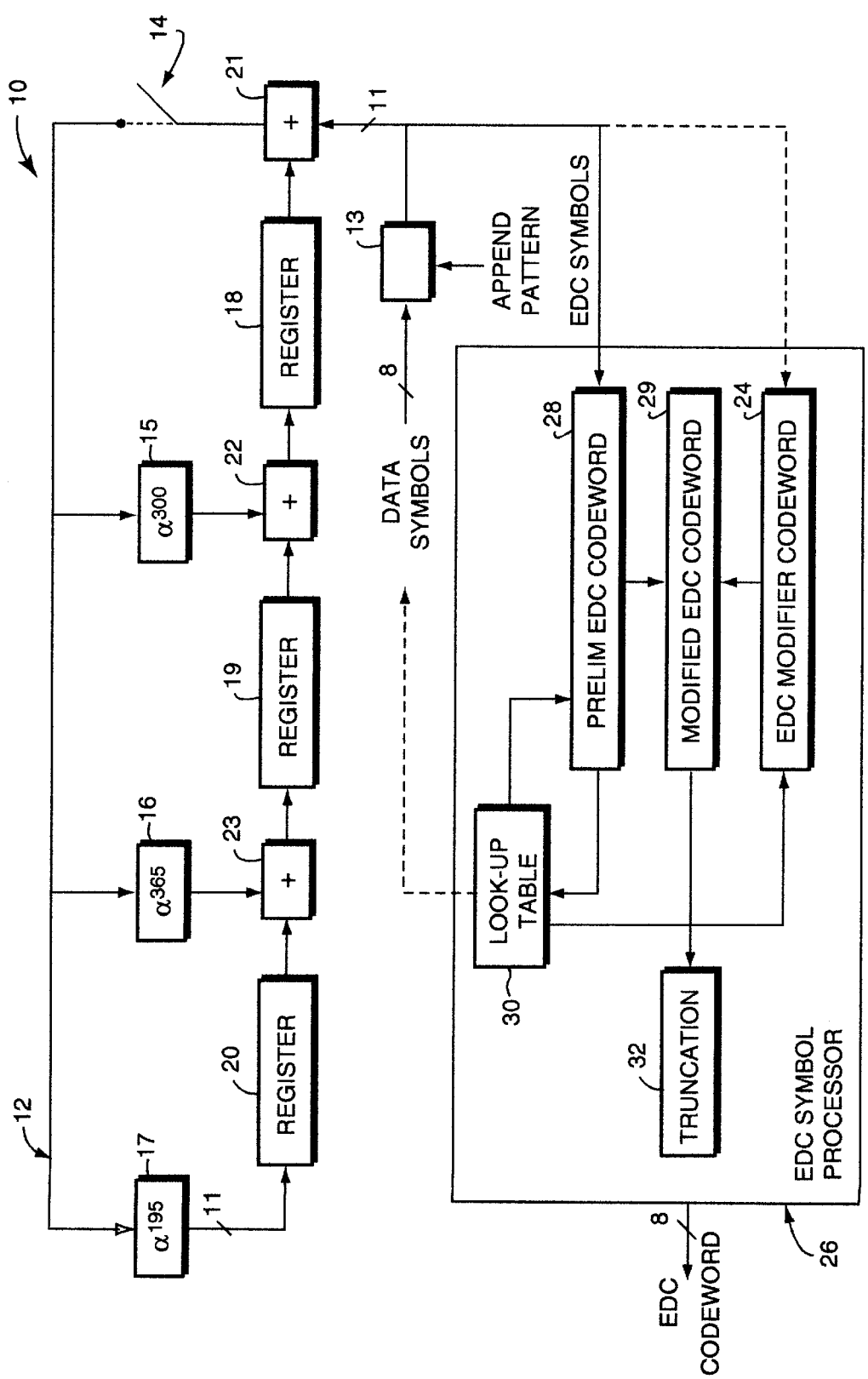
FIG. 1 is a functional block diagram of an encoding system constructed in accordance with the invention.

For selected w+i, the Galois Field, $GF(2^{w+i})$ can be generated by an irreducible polynomial $$p(x)=x^{w+i}+x^{w+i-1}+ \ldots +x^2+x+1.$$

A paper by J. K. Wolf entitled "*Efficient Circuits For Multiplying in GF(2$^m$) For Certain Values of m*", published in *Discrete Mathematics* 106/107 (1992) pp. 497–502, discusses these fields and is incorporated herein by reference. The first few values of m=w+i are 2, 4, 10, 12, 18, 28, 36, 52, 58, 60 . . .

The "x" is not a primitive element, however. So, for each of these fields we determine a polynomial $h(x)$, such that all of the non-zero field elements can be expressed as a power of $h(x)$ modulo $p(x)$. The polynomial $h(x)$ thus represents a primitive element of the field.

As an example, for w+i=10, $GF(2^{w+i})$ or $GF(2^{10})$ has an irreducible polynomial $$p(x)=x^{10}+x^9+x^8+x^7+x^6+x^5+x^4+x^3+x^2+x^1+1$$

and a polynomial $$h(x)=x^3+x+1.$$

Each element of $GF(2^{10})$ can thus be expressed as a power of $x^3+x+1$ modulo $p(x)$.

Each element of a Galois Field $GF(2^m)$, where m=w+i and m is one of the values discussed in the Wolf paper, may be represented by a degree m−1 polynomial, that is, by an m-bit symbol. The element is thus associated with a unique symbol $a(x)$. When the element of $GF(2^m)$ is instead represented by a degree m polynominal, that is, by an (m+1)-bit symbol, the element is associated with two distinct, but related symbols b(x) and c(x), where $$b(x)+c(x)=p(x).$$

The symbols b(x) and c(x) are thus complements.

For m=10, the 10-bit elements of GF($2^{10}$) and the 11-bit representations of the elements, which are generated by h(x) modulo p(x), are shown below:

|  | 10-bit representation | 11-bit representation |
|---|---|---|
| "0" | 0000000000 | 00000000000 or 11111111111 |
| $\alpha^0$ | 0000000001 | 00000000001 or 11111111110 |
| $\alpha^1$ | 0000001011 | 00000001011 or 11111110100 |
| $\alpha^2$ | 0001000101 | 00001000101 or 11101110101 |
| $\alpha^3$ | 1011100111 | 01011100111 or 10100011000 |
| $\alpha^4$ | 0000010011 | 00000010011 or 11111101100 |
| $\alpha^5$ | 0010101101 | 00010101101 or 11101010010 |
| $\alpha^6$ | 1101100000 | 01101100000 or 10010011111 |
| $\alpha^7$ | 0101011100 | 00101011100 or 11010100011 |
| $\alpha^8$ | 0100000101 | 00100000101 or 11011111010 |
| $\alpha^9$ | 1100100110 | 01100100110 or 10011011001 |
| $\alpha^{10}$ | 1110100110 | 01110100110 or 10001011001 |
| $\alpha^{11}$ | 0111011001 | 00111011001 or 11000100110 |
| $\alpha^{12}$ | 1101011101 | 01101011101 or 10010100010 |
| $\alpha^{13}$ | 0011110011 | 00011110011 or 11100001100 |
| $\alpha^{14}$ | 0101110010 | 00101110010 or 11010001101 |
| $\alpha^{15}$ | 0000000111 | 00000000111 or 11111111000 |
| $\alpha^{16}$ | 0000110001 | 00000110001 or 11111001110 |
| $\alpha^{17}$ | 0111011011 | 00111011011 or 11000100100 |
| $\alpha^{18}$ | 1101001011 | 01101001011 or 10010110100 |
| $\alpha^{19}$ | 0001111001 | 00001111001 or 11110000110 |
| $\alpha^{20}$ | 1101000011 | 01101000011 or 10010111100 |
| $\alpha^{21}$ | 0000100001 | 00000100001 or 11111011110 |
| $\alpha^{22}$ | 0101101011 | 00101101011 or 11010010100 |
| $\alpha^{23}$ | 0011100100 | 00011100100 or 11100011011 |
| $\alpha^{24}$ | 0111110011 | 00111110011 or 11000001100 |
| $\alpha^{25}$ | 1001110011 | 01001110011 or 10110001100 |
| $\alpha^{26}$ | 1011110000 | 01011110000 or 10100001111 |
| $\alpha^{27}$ | 0010010010 | 00010010010 or 11101101101 |
| $\alpha^{28}$ | 1011011001 | 01011011001 or 10100100110 |
| $\alpha^{29}$ | 0110100001 | 00110100001 or 11001011110 |
| $\alpha^{30}$ | 0000010101 | 00000010101 or 11111101010 |
| $\alpha^{31}$ | 0010010111 | 00010010111 or 11101101000 |
| $\alpha^{32}$ | 1011111110 | 01011111110 or 10100000001 |
| $\alpha^{33}$ | 0011110000 | 00011110000 or 11100001111 |
| $\alpha^{34}$ | 0101101111 | 00101101111 or 11010010000 |
| • | • | • |
| • | • | • |
| • | • | • |
| $\alpha^{1007}$ | 0111110101 | 00111110101 or 11000001010 |
| $\alpha^{1008}$ | 1001001001 | 01001001001 or 10110110110 |
| $\alpha^{1009}$ | 1101101110 | 01101101110 or 10010010001 |
| $\alpha^{1010}$ | 0100111110 | 00100111110 or 11011000001 |
| $\alpha^{1011}$ | 1010110011 | 01010110011 or 10101001100 |
| $\alpha^{1012}$ | 1001001111 | 01001001111 or 10110110000 |
| $\alpha^{1013}$ | 1101010100 | 01101010100 or 10010101011 |
| $\alpha^{1014}$ | 0010100000 | 00010100000 or 11101011111 |
| $\alpha^{1015}$ | 1100011111 | 01100011111 or 10011100000 |
| $\alpha^{1016}$ | 1000100101 | 01000100101 or 10111011010 |
| $\alpha^{1017}$ | 0010111010 | 00010111010 or 11101000101 |
| $\alpha^{1018}$ | 1111100001 | 01111100001 or 10000011110 |
| $\alpha^{1019}$ | 1100101000 | 01100101000 or 10011010111 |
| $\alpha^{1020}$ | 1111000100 | 01111000100 or 10000111011 |
| $\alpha^{1021}$ | 1001101111 | 01001101111 or 10110010000 |
| $\alpha^{1022}$ | 1000110100 | 01000110100 or 10111001011 |

The encoding and decoding systems discussed below with reference to FIGS. 1 and 3 preferably use the 11-bit symbol representations, which have the following advantages:

First, raising an 11-bit symbol to a power of $2^i$ is a permutation of the bits of the symbol. For a symbol b(x):

$$b(x)=b_{10}x^{10}+b_9x^9+ \ldots b_1x+b_0$$

represented by the coefficients, or bits, $$b(x)=b_{10}b_9b_8b_7b_6b_5b_4b_3b_2b_1b_0,$$

b(x) raised to various powers $2^i$ is, respectively:

$$(b(x))^2=b_5b_{10}b_4b_9b_3b_8b_2b_7b_1b_6b_0$$

$$(b(x))^4=b_8b_5b_2b_{10}b_7b_4b_1b_9b_6b_3b_0$$

$$(b(x))^8=b_4b_8b_1b_5b_9b_2b_6b_{10}b_3b_7b_0$$

where the coefficient of $x^k$ of $[b(x)]^{2^i}$ is the coefficient of $x^{((2-i)*k)mod\ 11}$ of b(x).

Second, the multiplication of two 11-bit symbols can be performed by exclusive-OR'ing cyclically shifted copies of one of the symbols with the coefficients, or bits, of the other symbol. For two symbols b(x) and d(x), where $$b(x) = b_{10}b_9b_8b_7b_6b_5b_4b_3b_2b_1b_0$$

and $$d(x) = d_{10}d_9d_8d_7d_6d_5d_4d_3d_2d_1d_0,$$

$$\begin{aligned}b(x)*d(x) = &b_0*(d_{10}d_9d_8d_7d_6d_5d_4d_3d_2d_1d_0)+\\&b_1*(d_9d_8d_7d_6d_5d_4d_3d_2d_1d_0d_{10})+\\&b_2*(d_8d_7d_6d_5d_4d_3d_2d_1d_0d_{10}d_9)+\\&b_3*(d_7d_6d_5d_4d_3d_2d_1d_0d_{10}d_9d_8)+\\&b_4*(d_6d_5d_4d_3d_2d_1d_0d_{10}d_9d_8d_7)+\\&b_5*(d_5d_4d_3d_2d_1d_0d_{10}d_9d_8d_7d_6)+\\&b_6*(d_4d_3d_2d_1d_0d_{10}d_9d_8d_7d_6d_5)+\\&b_7*(d_3d_2d_1d_0d_{10}d_9d_8d_7d_6d_5d_4)+\\&b_8*(d_2d_1d_0d_{10}d_9d_8d_7d_6d_5d_4d_3)+\\&b_9*(d_1d_0d_{10}d_9d_8d_7d_6d_5d_4d_3d_2)+\\&b_{10}*(d_0d_{10}d_9d_8d_7d_6d_5d_4d_3d_2d_1)\end{aligned}$$

where "*" represents multiplication over GF(2). Note that the components of d(x) of each row above are cyclically shifted copies of each other. The symbols b(x) and d(x) can be interchanged, to achieve the same result.

Third, constant multipliers are easily implemented, with a minimum number of exclusive OR gates, when the 11-bit representation with the lower weight is used. For example, multiplying $$b(x)=b_{10}b_9b_8b_7b_6b_5b_4b_3b_2b_1b_0$$

by the 11-bit constant 1110111011, which is also represented by 0001000100, is accomplished by using the lower weight representation and cyclically shifting b(x) by two bits and adding, that is, exclusive-OR'ing, the result to the result of b(x) cyclically shifted by six bits:

$$b_{10}b_9b_8b_7b_6b_5b_4b_3b_2b_1* \ 0001000100=1*(b_8b_7b_6b_5b_4b_3b_2b_1b_{10}b_9)+\\1*(b_4b_3b_2b_1b_{10}b_9b_8b_7b_6b_5)$$

If the lower weight version of the 11-bit representations is used for every multiplication operation, the maximum number of cyclically shifted copies of a symbol that must be added together is five. In contrast, multiplying two 10-bit symbols may require adding together up to 10-modified copies of one of the symbols. Further, the modifications to the 10-bit copies are typically more complex than cyclic shifts.

2. The Encoding System

Referring to FIG. 1, an encoding system 10 includes a Reed Solomon encoder 12 that encodes data in accordance with a distance d generator polynomial g(x) over $GF(2^{w+i})$ to produce (w+i+1)-bit redundancy symbols. In the example w=8, i=2 and d=4, and the generator polynomial over $GF(2^{10})$ is:

$$g(x)=(x+\alpha^{64})*(x+\alpha^{65})*(x+\alpha^{66})=x^3+\alpha^{300}x^2+\alpha^{365}x+\alpha^{195}$$

Figure 2:
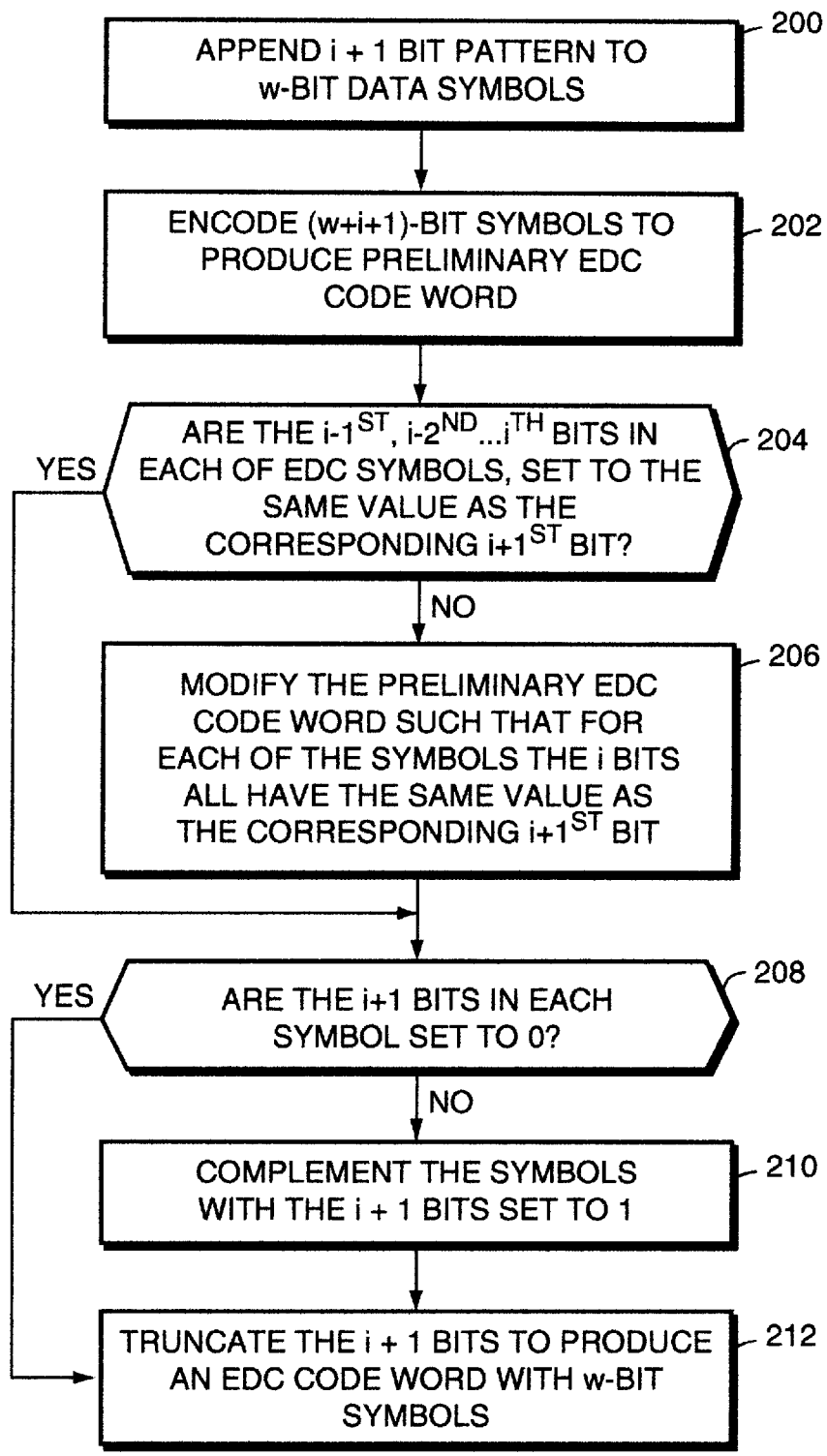
FIG. 2 is a flow chart of the operations of the encoder of FIG. 1.

Referring also to FIG. 2, before data and ECC symbols, which are all elements of $GF(2^w)$ or $GF(2^8)$ and are referred to collectively as data symbols, are encoded i+1 zeros are appended to or included in the symbols in register 13 (step 200). In the example three zeros are appended to the 8-bit symbols to form 11-bit symbols. With a switch 14 in the closed position, the 11-bit data symbols are added to the contents of a register 18 in adder 21. The sum is then multiplied in multipliers 15, 16, and 17 by the constants $\alpha^{300}$, $\alpha^{365}$ and $\alpha^{195}$, respectively, which are the coefficients of the generator polynomial. The coefficients are in the form of their lowest weight 11-bit representations, and the multipliers 15–17 are implemented with a minimum number of exclusive-OR gates.

The products from multipliers 15 and 16 are added, modulo 2, in adders 22 and 23 to the contents of registers 19 and 20, respectively. These sums then update the registers 18 and 19. Similarly, the product produced by the multiplier 17 updates the register 20.

After all of the data symbols have been applied to the encoder 12 and encoded as 11-bit symbols, the contents of the registers 18–20 are 11-bit representations of the EDC redundancy symbols. The switch 14 is then opened, and the 11-bit EDC redundancy symbols are shifted out of the encoder and into a register 24, as the coefficients of the $x^3$, $x^2$ and x terms, respectively, of a preliminary EDC code word (step 202). The coefficient of the constant term, $x^0$, is set to zero.

The encoding system next determines if the preliminary EDC code word requires modifying (steps 204, 206). For each of the EDC redundancy symbols an EDC symbol processor 26 determines if the leading i+1 bits are all set to the same value. In the example, the system determines in processor 26 if in each EDC redundancy symbol the bits in positions $x^9$ and $x^8$ are set to the same bit value as the bit in position $x^{10}$. The system thus determines for a particular EDC redundancy symbol that has the leading bit set to a one, if the second and third leading bits are also both 1s. If not, the processor 26 modifies the EDC symbol by combining the preliminary code word from register 24 and an EDC modifier codeword in register 28 that is produced by the processor.

The EDC modifier code word is essentially a combination of one or more modifying code words $r_c$, which each have a different one of the leading $x^{w+i-1}$ to $x^w$ bits set to a one and each of the other of these bits set to zeros. More specifically, there are i*(d–1) modifying code words, one for each of the bits in bit positions $x^{w+i-1}$ to $x^w$ in each of the d–1 EDC redundancy symbols. In the example there are six modifying code words, one to modify bits 8 and 9, respectively, in each of the three EDC symbols.

When a particular one of these bits in a given EDC redundancy symbol does not have the same value as the leading bit, i.e., as the bit in bit position $x^{w+i}$, the encoder modifies the EDC redundancy symbols to alter that particular bit. To do this, the encoder combines the EDC redundancy symbols with the appropriate symbols of the modifying code word that has the corresponding bit set to a one, as discussed in more detail in the example below. If another of the i+1 bits is not set to the same value as the leading bit, the EDC redundancy symbols are further modified by combining them also with the modifying code word that has that particular bit set to a one.

The processor 26 also produces R pseudo redundancy symbols $P_1, P_2, \ldots$. The pseudo redundancy symbols, which have their i+1 bits set to all zeros, are appended to the modified EDC redundancy symbols, to ensure proper decoding of the EDC code word. The number of pseudo redundancy symbols required is $$R = \left\lceil \frac{i * \deg(g(x))}{w} \right\rceil$$

where deg(g(x)) is the degree of the generator polynomial and [ ] represents the ceiling function. In the example, R=1, and the EDC pseudo redundancy symbol is the constant term of the EDC code word, that is, it is the coefficient of the $x^0$ term.

Once the EDC symbols are modified, as necessary, the encoding system determines if the first i+1 coefficients of an EDC redundancy symbol are all 0s (step 208). If so, the system truncates the i+1 bits from the symbol to produce a w-bit modified EDC redundancy symbol (step 212). If the i+1 bits are all 1s, the system first complements the symbol, to turn these bits into all 0s, and then truncates the bits to produce the corresponding w-bit modified EDC symbol (steps 210, 212). The system does this for each of the EDC redundancy symbols, and produces an EDC code word with symbols that are elements of $GF(2^w)$.

In the example, the modifying code words are:

$$r_0 = \alpha^{829}*x^3 + \alpha^{106}*x^2 + \alpha^{171}*x + \alpha^1$$

$$r_1 = \alpha^{164}*x^3 + \alpha^{464}*x^2 + \alpha^{529}*x + \alpha^{359}$$

$$r_2 = \alpha^{126}*x^3 + \alpha^{426}*x^2 + \alpha^{491}*x + \alpha^{321}$$

$$r_3 = \alpha^{177}*x^3 + \alpha^{477}*x^2 + \alpha^{542}*x + \alpha^{372}$$

$$r_4 + \alpha^{251}*x^3 + \alpha^{551}*x^2 + \alpha^{616}*x + \alpha^{446}$$

$$r_5 = \alpha^{953}*x^3 + \alpha^{230}*x^2 + \alpha^{295}*x + \alpha^{125}$$

The modifying code words $r_c$, which are selected to have constant terms that have their i+1 bits set to all 0s, are preferably selected using the system and techniques discussed in co-pending U.S. patent application Ser. No. 08/749,235, entitled MODIFIED REED SOLOMON CODE SELECTION AND ENCODING SYSTEM, which is assigned to a common assignee and incorporated herein by reference.

The modifying code word ro, which is used to modify bit 8 of the coefficient of $x^1$, has a corresponding symbol with a one as its bit 8 and zeros as its bits 10 and 9, and in each of the remaining code word symbols all zeros as the respective bits 10, 9 and 8. The modifying code word $r_1$, which is used to modify bit 9 of the coefficient of $x^1$, has a corresponding symbol with a one as its bit 9 and zeros as the bits 10 and 8, and in each of the remaining code word symbols all zeros as the respective bits 10, 9 and 8. The modifying code words $r_2$ and $r_3$, which are used to modify the coefficient of $x^2$ and $r_4$ and $r_5$, which are used to modify the coefficient of $x^3$, similarly have bit 8 or bit 9 of the corresponding symbols set to ones, the remaining i bits of these symbols set to zeros, and in each of the remaining symbols all of the respective i+1 bits set to zeros.

The modifying code words are stored in modifier table 30. Alternatively, only the one non-zero "information" symbol of each of these code words may be stored in the table. The system then encodes each of the stored symbols in encoder 12, to reproduce the code words $r_c$. The table 30 may thus contain for each code word the coefficient of $X^3$.

As an example, the encoder 12 encodes the data to produce the following preliminary EDC code word redundancy symbols:

$$c_3 = 10101101011 x^3$$

$$c_2 = 01111101010 x^2$$

$$c_1 = 11111101111 x^1$$

and the coefficient of $x^0$ is set to all zeros. The EDC modifying code word is then a combination of $r_5$, to modify bit 9 of the coefficient of $x^3$, and $r_2$ and $r_3$ to modify respectively bits 9 and 8 of the coefficient of $x^2$.

The non-zero information symbol of the modifying code word is thus a combination of the non-zero information symbols of the code words $r_5$, $r_3$ and $r_4$:

$$\alpha^{953} + \alpha^{177} + \alpha^{126} = \alpha^{293}$$

which is encoded in encoder 12 to produce the EDC modifying code word:

$$\alpha^{293} x^3 + \alpha^{593} x^2 + \alpha^{658} x^1 + \alpha^{488} x^0$$

which in binary form is:

$$1101100100 x^3 + 1100100000 x^2 + 00011110101 x + 0000111001.$$

This code word is combined with the redundancy symbols of the EDC preliminary code word, that is, the coefficients of the EDC modifying code words are combined with the redundancy symbols of the EDC preliminary code word to form the redundant symbols of the EDC code word:

$$c'_3 = 10101101011 + 1011100100 = 11110001111 = \alpha^{108}$$

$$c'_2 = 01111101010 + 01100100000 = 00011001010 = \alpha^{460}$$

$$c'_1 = 11111101111 + 00011110101 = 11100011010 = \alpha^{164}$$

$$c'_0 = 00000000000 + 00000111001 = 00000111001 = \alpha^{488}$$

and the final EDC modifying code word is thus:

$$\alpha^{108} x^3 + \alpha^{460} x^2 + \alpha^{164} x^1 + \alpha^{488} x^0$$

The system then in subprocessor 32 truncates the i+1 bits from the EDC symbols that have the i+1 bits set to all 0s. Before truncating the i+1 bits from the symbols that have these bits set to 1s, the system complements the symbols to set the i+1 bits to all zeros. In the example, the system first complements the coefficients of $x^3$ and $x^1$ and then truncates the i+1 bits from each of the EDC code word symbols, to produce an EDC code word with symbols in $GF(2^8)$. The 8-bit EDC redundancy symbols are then recorded in a sector with the 8-bit data and ECC symbols.

Figure 3:
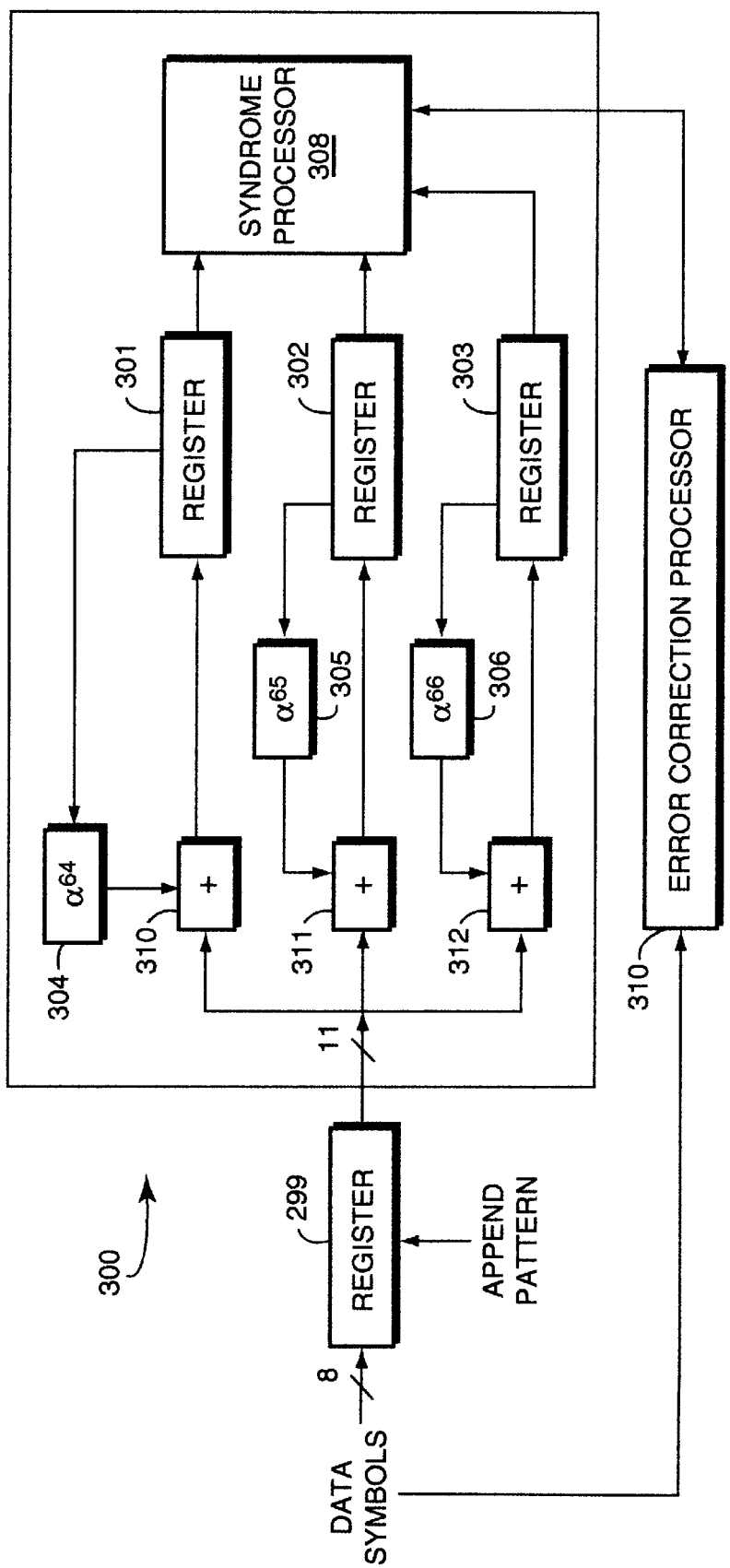
FIG. 3 is a functional block diagram of a decoding system constructed in accordance with the invention.
Figure 4:
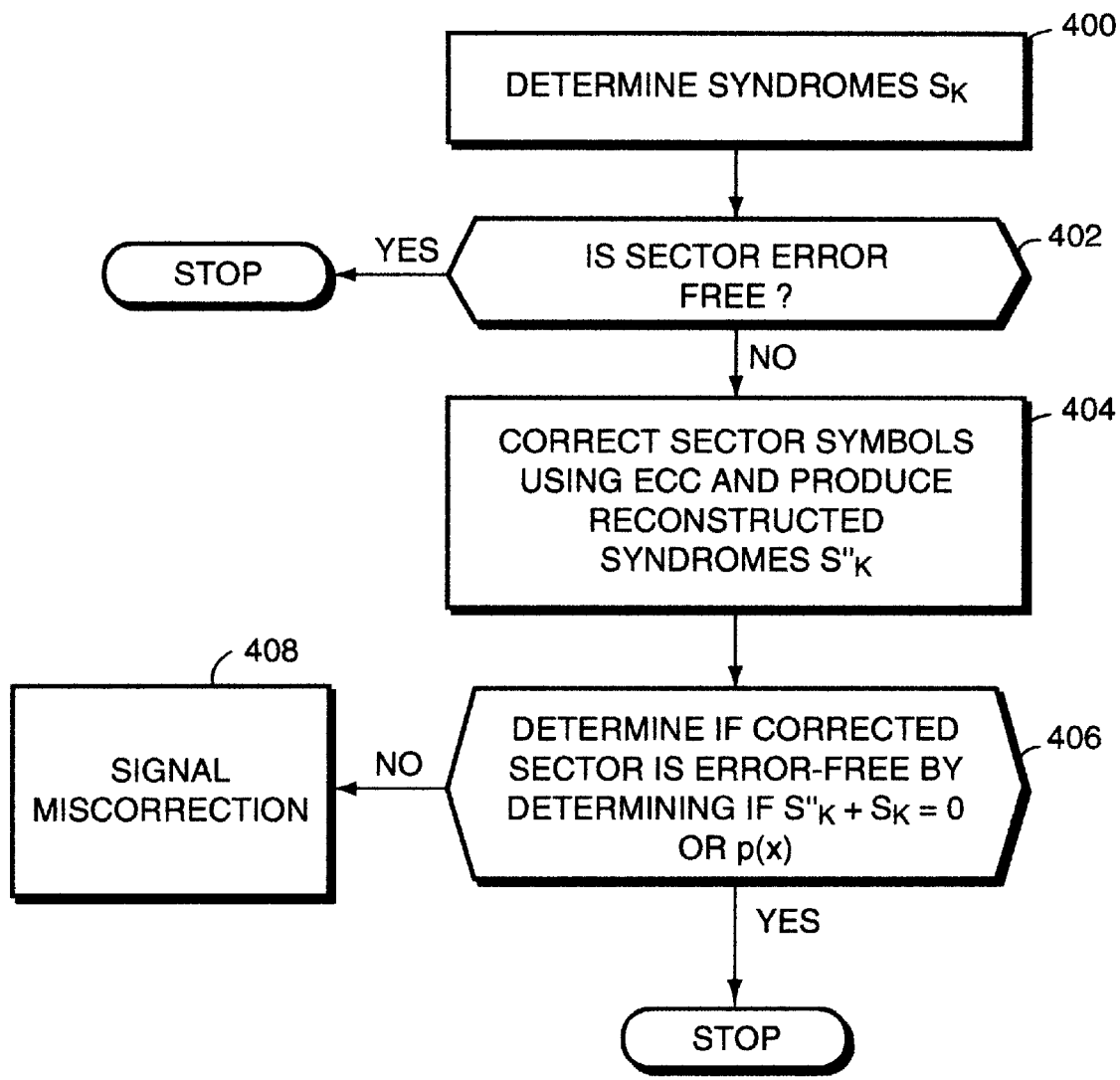
FIG. 4 is a flow chart of the operations of the decoder of FIG. 3.

Referring now to FIGS. 3 and 4, a decoder 300 cross checks the sector symbols by determining error syndromes $s_{64}$, $s_{65}$ and $s_{66}$ using the EDC code word, which includes the data symbols, the modified EDC symbols and the pseudo redundancy symbol (step 400). The decoder 300 includes three registers 301, 302, 303, which at the end of the encoding contain the error syndromes, and three multipliers 304, 305, 306 that, respectively, multiply the contents of the registers 301–303 by a constant $\alpha^k$, where k=64, 65 or 66.

Before the sector symbols are applied to the decoder 300, the system appends i+1, or three, all zero bits to the symbols in register 299. The 11-bit symbols are then applied to each of the adders 310, 311, 312, which also receive, respectively, the products from the multipliers 304–306. The symbol and the respective products are combined and the results are used to update the registers 301–303. When all of the sector symbols have been encoded, the registers 301–303 contain the syndromes $s_{64}$, $s_{65}$ and $s_{66}$.

A syndrome processor 308 determines a sector is error-free if the EDC syndromes $s_{64}$, $s_{65}$ and $s_{66}$ are all either all zeros or equal to p(x), and the ECC syndromes produced in a known manner by the interleaved ECC are all zeros (step 402).

If the sector is not error-free, an error correction processor 310 corrects the errors in a known manner in accordance with the ECC and the syndrome processor 308 reconstructs EDC syndromes $s'_k$ based on the error locations, $eloc_i$, and error values, $eval_i$, determined by the ECC (step 404). First, the system determines partial reconstructed EDC syndromes $$s'_{k,i} = (\alpha^{eloc_i})^k * eval_i,$$

for k=64, 65, 66 and i=0, 1, 2 ... z−1, where z equals the number of errors. For k=64, which is $2^6$, the value of $(\alpha^{eloc_i})^k$ is a permutation of $\alpha^{eloc_i}$.

Figure 5:
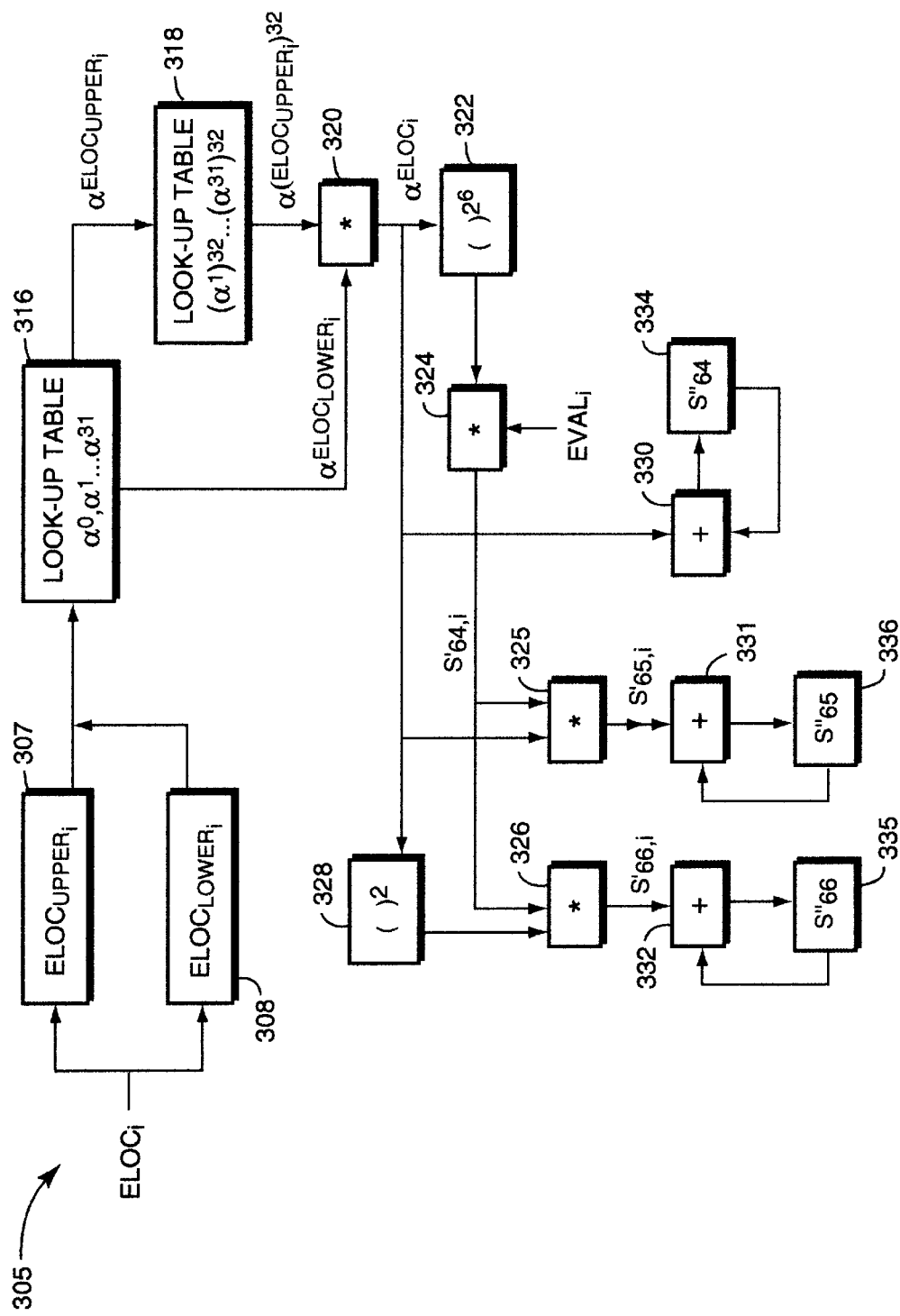
FIG. 5 is a functional block diagram of a portion of a syndrome processor depicted in FIG. 3.

Referring also to FIG. 5, the syndrome processor 308 raises the 10-bit element $\alpha^{eloc_i}$ to the $2^6$ power using two look-up tables 316 and 318, a multiplier 320 and permutation hardware 322.

Let $eloc_i = elo_{upper_i} * 32 + eloc_{lower_i}$ where $eloc_{upper_i}$ consists of the five most significant bits of $eloc_i$, and $eloc_{lower_i}$ consists of the five least significant bits of the 10-bit symbol $eloc_i$. Then $$\alpha^{eloc_i} = (\alpha^{eloc_{upper}i})^{32} * (\alpha^{eloc_{lower}i}).$$

Since both $eloc_{upper_i}$ and $eloc_{lower_i}$ are bounded by 32, i.e., by $2^5$ a table 316 that produces $\alpha^{eloc_{upper}i}$ and $\alpha^{eloc_{lower}i}$ has just 32 entries. The table thus contains entries for $\alpha^0$ to $\alpha^{31}$ and preferably contains the lower weight 11-bit representations of these elements. The 32-entry table can thus be used in place of a $2^{10}$ entry table, saving not only storage space but also reducing considerably the complexity of the associated table addressing circuitry.

The value $(\alpha^{eloc_{upper}i})^{32}$ is then a permutation of $\alpha^{eloc_{upper}i}$. This permutation can be performed in hardware or by using the second look-up table 318, which also has just 32 entries. Once this value is determined, it is multiplied in multiplier 320 by $\alpha^{eloc_{lower}i}$ to produce $\alpha^{eloc_i}$. Finally, raising $\alpha^{eloc_i}$ to the power $2^6$ is a permutation that can be performed in hardware, which is denoted 322 in the drawing.

After the reconstructed partial EDC syndromes $s'_{64,i}$ are determined, the associated partial syndromes $s'_{65,i}$ and $s'_{66,i}$ can be readily determined as:

$$s'_{65,i}=s'_{64,i}*\alpha^{eloc_i}$$

and $$s'_{66,i}=s'_{65,i}*\alpha^{eloc_i}=s'_{64,i}*(\alpha^{eloc_i})^2$$

using multipliers 324–326, adders 330–333 and permutation hardware 328.

The final reconstructed EDC syndromes are then $$s''_k=s'_{k,0}+s'_{k,1}+\ldots+s'_{k,z-1}$$

for k=64, 65 and 66, where z is the number of errors determined by the ECC.

To determine if the corrected sector is error-free, the syndrome processor, in step 406, combines the EDC syndromes sk and the final reconstructed EDC syndromes $s''_k$ and determines if the combination equals either all zeros or p(x). If so, the system determines that the corrected sector is error-free. If not, the system determines that the sector has been miscorrected (step 408).

The encoder and decoder of FIGS. 1 and 3 may use another code over $GF(2^{10})$, which has as a generator polynomial $$g(x)=x^3+\alpha^{422}x^2+\alpha^{609}x+\alpha^{561}$$

For this code the entries in the EDC modifier code word table 30, which are the coefficients of the $x^3$ terms of the EDC modifying code words $r_c$, are:

$r_0$   $\alpha^{821}$ $r_1$   $\alpha^{462}$ $r_2$   $\alpha^{21}$ $r_3$   $\alpha^{723}$ $r_4$   $\alpha^{783}$ $r_5$   $\alpha^{736}$.

The encoding and decoding systems described above use 11-bit symbols to simplify the hardware, and particularly the hardware required for multiplication and raising symbols to powers of $2^i$. Further, the decoder uses small look-up tables, and consequently relatively simple associated addressing circuitry to determine syndromes that are based on the error locations and values. The entire cross check system is thus relatively inexpensive, and yet, protects entire data sectors against miscorrection.

What is claimed is:

1. A method for encoding data symbols into code words using a distance d modified Reed-Solomon error detection code ("EDC") over Galois Field ($p^{w+i}$) to produce an EDC code word in GF($p^w$), the method including the steps of:

A. appending i+1 bits to w-bit symbols and encoding the symbols to produce d–1 (w+i+1)-bit EDC redundancy symbols that are each powers of h(x) modulo p(x), where h(x) is a primitive element of the field and p(x) is an irreducible polynomial of the form $p(x)=x^{w+i}+x^{w+i-1}+\ldots+x^2+x+1$;

B. producing a preliminary EDC code word that includes the EDC redundancy symbols and a predetermined constant term;

C. ascertaining which, if any, of the i selected bits in each of the preliminary EDC code word symbols are not set to the same value as the corresponding i+$1^{st}$ bit, and forming a modified EDC code word by combining the preliminary EDC code word with a modifying code word that has selected bits of the i+1 bits in each of the symbols set to ones and the remaining bits of the i+1 bits in each of the symbols set to zeros, to produce code word symbols in which the i bits have the same value as the corresponding i+$1^{st}$ bit;

D. complementing the symbols that have the i+1 bits set to all 1s; and

E. truncating the i+1 bits from the code word symbols, to produce an EDC code word with w-bit symbols.

2. The encoding method as recited in claim 1 wherein the modifying step further includes:

a. selecting one or more modifying code words for each EDC symbol in response to the location of each one of the selected i bits in the symbol that does not match the corresponding i+$1^{st}$ bit;

b. combining the modifying code words to produce the ECC modifier code word.

3. The method recited in claim 1 wherein the modifying step further includes:

a. selecting information symbols that correspond to one or more modifying code words for each EDC symbol, in response to the location of each one of the selected i bits of the symbol that does not match the corresponding i+$1^{st}$ bit;

b. combining the selected information symbols; and c. encoding the combination to produce an EDC modifier code word that includes d–1 EDC symbol modifiers and P pseudo redundancy symbol modifiers.

4. A method for encoding data symbols using a modified Reed Solomon code over GF($p^{w+i}$) to produce a code word with symbols in GF($p^w$), the method including the steps of:

A. selecting a distance d code over a Galois Field that has an irreducible polynomial p(x) with w+i+1 terms and in which the field symbols are determined by a polynomial h(x) modulo p(x) and h(x) is a primitive element of the field;

B. representing each symbol of GF($p^{w+i}$) as a (w+i+1)-bit symbol with a lower weight;

C. using a generator polynomial $g(x)=(x+\alpha^L)*(x+\alpha^{L+1})*\ldots(x+\alpha^{L+n-k-1})$, and encoding the (w+i+1)-bit symbols to produce (w+i+1)-bit EDC symbols;

D. modifying the EDC symbols to produce a preliminary EDC code word that has symbols in which selected i bits match an i+$1^{st}$ bit;

E. truncating the selected i+1 bits to produce an EDC code word with w-bit symbols.

5. The method of claim 4 wherein the step of selecting a code further includes selecting a code over a Galois Field that is associated with the irreducible polynomial $$p(x)=x^{w+i}+x^{w+i-1}+\ldots+x^1+x^0.$$

6. The method of claim 4 wherein the step of encoding uses (w+i+1)-bit representations of the symbols of GF($2^{2+i}$), the encoding using the (w+i+1)-bit representation with the lower weight.

7. An encoder for encoding w-bit symbols in accordance with a distance d code over $GF(2^{w+i})$ to produce $(w+i+1)$-bit redundancy symbols, the encoder including:
   A. $d-1$ multipliers that each multiply $(w+i+1)$-bit representations of the $GF(2^{w+i})$ symbols and a $(w+i+1)$-bit representation of a coefficient of a generator polynomial by combining cyclically shifted versions of the $(w+i+1)$-bit representations of the symbols; and
   B. $d-2$ adders that add $(w+i+1)$-bit products produced by the multipliers to $(w+i+1)$-bit representations of the symbols or to previous sums produced by the adders, the adders producing the $(w+i+1)$-bit redundancy symbols when all of the w-bit symbols are encoded.

8. A method for detecting errors in a code word with symbols in $GF(p^w)$ that was produced by encoding w-bit data symbols using a modified Reed Solomon code over $GF(p^{w+i})$, the method including the steps of:
   A. representing the w-bit code word symbols by $(w+i+1)$-bit symbols that are determined by a polynomial $h(x)$ modulo $p(x)$ with $p(x)=x^{w+i}+x^{w+i-1}+\ldots+x^1+x^0$ and $h(x)$ representing a primitive element;
   B. using a generator polynomial $g(x)=(x+\alpha^L)*(x+\alpha^{L+1})*\ldots(x+\alpha^{L+d-1})$, encoding the $(w+i+1)$-bit code word symbols to produce syndromes $S_L, S_{L+1}, \ldots, S_{L+d-1}$;
   D. determining if the syndromes are equal to zero or $p(x)$, and if so, determining that the code word is error-free and providing the error-free data symbols;
   E. determining, if the syndromes are not equal to zero or $p(x)$, that the code word is not error-free and asserting a signal that indicates that the data are erroneous.

9. The method of claim 8 wherein the $(w+i+1)$-bit representations of the symbols of $GF(2^{w+i})$ are the $(w+i+1)$-bit representation with the lower weight.

10. The method of claim 8 further including the steps of:
   F. determining reconstructed syndromes $s'_L, s'_{L+1}, \ldots, s'_{L+d-1}$ associated with a corrected code word using error locations and error values associated with the syndromes;
   G. combining the syndromes and the reconstructed syndromes; and
   H. if the combination equals zero or $p(x)$ producing the error-free data associated with the reconstructed syndromes; and
   J. if the combination does not equal zero or $p(x)$ asserting a signal that indicates that the data are uncorrectable.

11. The method of claim 10 wherein the step of determining reconstructed syndromes further includes:
   a. determining partial reconstructed syndromes $s'_{L,i}$ for each of i error locations and associated error values;
   b. determining the reconstructed syndromes $s'_{L+1,i}, \ldots s'_{L+d-1,i}$ by multiplying the partial reconstructed syndromes $s'_{L,i}$ by powers of $\alpha^{eloc_i}$, where $\alpha^{eloc_i}$ is based on the error location $eloc_i$; and
   c. producing final reconstructed syndromes as $s''_L = s'_{L,0} + s'_{L,1} + \ldots + s_{L,z-1}$ where z is the number of errors.

12. The method of claim 11 wherein the step of determining the syndromes further includes:
   c. using a $2^{(w+i)/2}$ element look-up table to determine $\alpha^{eloc_{upper}i}$ and $\alpha^{eloc_{lower}i}$ where $upper_i$ and $lower_i$ are, respectively, the $(w+i)/2$ most and least significant bits of $eloc_i$,
   d. determining $\alpha^{eloc_i}$ as $(\alpha^{eloc_{upper}i})^{2^{(w+i)/2}}*(\alpha^{eloc_{lower}i})$; and
   e. determining the partial reconstructed syndrome $s'_{L,i} = (\alpha^{eloc_i})^{k}*eval_i$.

13. A decoding system for decoding a data codeword with w-bit symbols over a Galois Field $GF(p^{w+i})$ with a generator polynomial $g(x)=(x+\alpha^L)*(x+\alpha^{L+1})*\ldots(x+\alpha^{L+d-1})$ and an irreducible polynomial $p(x)$, the decoding system including:
   A. means for determining error locations $eloc_i$ and error values $eval_i$ using $(w+i+1)$-bit representations of the code word symbols;
   B. means for determining syndromes $S_L$ based on the error locations and error values and correcting the errors in accordance with the syndromes to produce a corrected data code word;
   C. means for determining if the corrected data code word is error-free, said means including
      a. means for producing partial reconstructed syndromes $s'_{L,i} = (\alpha^{eloc_i})^{k}*eval_i$,
      b. means for producing reconstructed syndromes $s'_{L+1,i}, s'_{L+2,i}, \ldots s'_{L+d-1,i}$ as $$s'_{L+1,i}=s'_{L,i}*(\alpha^{eloc_i}), s'_{L+2,i}=s'_{L,i}*(\alpha^{eloc_i})^2, \ldots s'_{L+d-1,i}=s'_{L,i}*(\alpha^{eloc_i})^{d-1},$$

c. means for producing final reconstructed syndromes as $$s''_L=s'_{L,0}+s'_{L,1}+s'_{L,2}+\ldots+s'_{L,z}, \ldots, s''_{L+d-1}=s'_{L+d-1,0}+s'_{L+d-1,1}+s'_{L+d-1,2}+\ldots+s'_{L+d-1,z}$$

where z is the number of errors determined by the system, and
   d. means for combining the corresponding syndromes and final reconstructed syndromes and determining the corrected data code word is error-free if the combination is all zeros or $p(x)$;
   D. means for providing the error-free data symbols of the corrected data code word if the corrected code word is error-free, and
   E. means providing an error signal if the corrected data code word is not error-free.

14. The decoding system of claim 13 wherein the means for producing reconstructed syndromes produces $\alpha^{eloc_i}$ as $(\alpha^{eloc_{upper}i})^{(w+i)/2}*(\alpha^{eloc_{lower}i})$, where $upper_i$ and $lower_i$ are, respectively, the $(w+i)/2$ most and least significant bits of $eloc_i$.

15. The decoding system of claim 14 wherein the means for producing reconstructed syndromes includes a $2^{(2+i)/2}$-entry lookup table that contains $\alpha^{eloc_{upper}i}$ and $\alpha^{eloc_{lower}i}$.

16. The decoding system of claim 15 wherein the means for producing reconstructed syndromes produces $(\alpha^{eloc_{upper}i})^{(w+i)/2}$ as a permutation of $\alpha^{eloc_{upper}i}$.

17. The decoding system of claim 15 wherein the means for producing reconstructed syndromes includes a second $2^{(w+i)/2}$-entry lookup table that contains $(\alpha^{eloc_{upper}i})^{(w+i)/2}$.

* * * * *